United States Patent
Watanabe et al.

(10) Patent No.: US 6,715,205 B2
(45) Date of Patent: Apr. 6, 2004

(54) APPARATUS FOR MOUNTING A WIRE COMPONENT

(75) Inventors: Hideaki Watanabe, Kofu (JP); Dai Yokoyama, Kofu (JP); Toshiyuki Koyama, Yamanashi-ken (JP); Hiromi Kinoshita, Yamanashi-ken (JP)

(73) Assignee: Matsushita Electric Industrial Co., Ltd., Osaka-fu (JP)

( * ) Notice: Subject to any disclaimer, the term of this patent is extended or adjusted under 35 U.S.C. 154(b) by 0 days.

(21) Appl. No.: 09/977,355

(22) Filed: Oct. 16, 2001

(65) Prior Publication Data

US 2002/0046463 A1 Apr. 25, 2002

(30) Foreign Application Priority Data

Oct. 16, 2000 (JP) .......................... 2000-315241

(51) Int. Cl.$^7$ .......................... H01R 43/00; H05K 13/00
(52) U.S. Cl. .......................... 29/854; 29/33 F; 29/741; 29/748; 227/84
(58) Field of Search .......................... 29/33 F, 33 M, 29/34 D, 854, 861, 868, 837, 833, 748, 749, 761, 709, 566.1, 741; 83/950, 105, 106, 443; 227/84, 90

(56) References Cited

U.S. PATENT DOCUMENTS

| | | | | |
|---|---|---|---|---|
| 4,395,805 A | * | 8/1983 | Tomko et al. ............... | 29/33 F |
| 4,696,424 A | * | 9/1987 | Misawa et al. ............... | 227/84 |
| 4,771,922 A | * | 9/1988 | Masada ........................ | 227/84 |

* cited by examiner

Primary Examiner—Carl J. Arbes
Assistant Examiner—Tim Phan
(74) Attorney, Agent, or Firm—Wenderoth, Lind & Ponack, L.L.P.

(57) ABSTRACT

An apparatus for mounting a wire component on a substrate has a feed device for feeding a wire a predetermined length intermittently, and an insert device for cutting the wire fed out by the feed device, bending the cut wire to form a wire component, rotating and positioning the wire component, and then inserting the wire component in a hole defined in the substrate. In particular, irrespective of a position of the insert device, the feed device feeds out the wire in a direction where no interference would occur between the feed device and the insert device.

17 Claims, 19 Drawing Sheets

APPARATUS FOR MOUNTING A WIRE COMPONENT

BACKGROUND OF THE INVENTION

A circuit board or substrate incorporated in an electric device bears a number of electronic components. Although most of the components are connected with one another only through circuits integrally formed on the board, some are connected with another components through bracket-like jump wires with opposite ends securely inserted in holes defined in the board.

FIG. 12 shows a conventional wiring machine generally indicated by reference numeral 1 for mounting the jump wire or wire component in the form of bracket or staple on the circuit board. The wiring machine 1 includes a wire supply 2 having a reel around which the wire is wound, a wire feeder 3 for feeding the wire sequentially, an insert machine 4 for cutting the incremental portion of the wire, bending the cut wire into a bracket-like wire component and then inserting opposite ends of the bracket-like wire component into the corresponding holes of the board. The machine 1 also includes a board holder 5 for transporting and then holding the circuit board in place and a controller 6 for controlling the whole operation of the machine 1.

FIGS. 13A and 13B show several parts incorporated in the wiring machine 1 and an electric connection of the parts. In particular, in FIG. 13A, the wire supply 3 is illustrated on the right side and the wire insert machine 4 is depicted on the left side, so that the circuit board 11 is retained under the wire insert machine 4. The wire supply 3 has a main frame 8 or body with a mechanism for feeding the wire. For this purpose, the mechanism has a pair of rotatable feed rollers 13 for holding the wire and feeding a certain length of the wire intermittently in the direction of arrow E from the reel. A wire guide 9 is also provided for the wire supply 3 for directing the fed wire toward the wire insert machine 4. To this end, the guide 9 has a tube or nozzle 16. The wire guide 9 is supported so that it swings about a vertical support axis 15 in a horizontal plane relative to the main frame 8 in the directions indicated by arrows C and D to change a direction in which the wire is extended. A motor 17 is drivingly connected with the rollers 13 so that the rollers 13 rotate to feed the wire 12. Also, an actuator 18 with an air-cylinder, for example, is drivingly connected at the support axis 15 so as to swing wire guide 9 and its guide nozzle 16. An amount of rotation of the motor 17 and a displacement of the actuator for the intermittent feeding of the wire are determined and controlled by the controller 6 (FIG. 12). For this purpose, as shown in FIG. 13B, the controller 6 includes central processing unit (CPU), sequential control, NC control. The sequential control is electrically connected with magnetic valves for driving the actuators or air-cylinders 18 and 27–29, described below. Also, the NC control is electrically connected with drivers for driving elements, for example, motors 17 and 26.

The wire insert machine 4 has a pair of cutters 21 and 22 for receiving the distal end portion of the wire 12 fed from the wire supply 3 and cutting the wire into a certain length and a bender for bending the cut wire into a predetermined shape in the form of bracket, for example, so that its opposite ends can be inserted in the corresponding holes of the circuit board. For this purpose, the pair of cutters 21 and 22 have movable blade 21a and 22a and fixed blades 21b and 22b, respectively. The movable blades 21a and 22a are supported for elevation so that they cooperates with the fixed blades 21b and 22b to cut a distal end potion of the wire, forming a piece of wire having a predetermined length. The bender 23 has a bending dye 24 and a pair of insert guides 25 positioned on outside, opposite sides of the bending dye 24. The blades 21a and 22, bending dye 24, and guides 25 are drivingly connected with actuators 27, 28, and 29, respectively. The insert guides 25 are mounted for elevation so that they moves downward to cooperate with the inward bending dyne 24 to bend the opposite ends of the cut wire in the form of bracket. After bending, the bending dye 24 is moved away by a linkage mechanism not shown.

The wire insert machine 4 is supported for rotation about a vertical axis parallel to the Z-axis and drivingly connected with a motor 26. This allows the insert machine 4 to rotate so that the opposite ends of the cut wire 12 to be positioned at the corresponding holes 19 in the circuit board 11. After positioning, the wire 12 is moved down with the guides 25 so that the opposite ends of the wire are inserted in the holes 19.

The actuators and motors may be substituted with another driving means. For example, the wire feeder may be made of a reciprocating linkage driven by a suitable drive so that the linkage catches the wire as it moves away from the reel and releases as it moves toward the reel, thereby advancing the wire intermittently.

Referring to FIGS. 14 to 26, operations of the wiring machine 1 so constructed will be described in detail. FIGS. 14 to 17 illustrate the operations performed by the machine, in which the wire insert machine 4 is not rotated for positioning of the wire at the insertion of the wire. As shown in FIG. 14, a certain length of the wire is forwarded through the guide nozzle 16 by a predetermined rotation of the rollers 13. At this moment, the guide nozzle 16 is rotated horizontally about the support axis 15 so that the wire 12 and the guide nozzle 16 do not interfere with the insert machine 4. Therefore, a portion of the wire 12 held between the guide nozzle 16 and the feed rollers 13 is curved away from a feed line 31 indicated by a short and long dotted line. The feed line 31 is a line extending at the center of and perpendicular to a line connecting the centers of the rollers 13. This causes that the wire 12 is forwarded along the feed line 31 if no biasing or transverse force is applied to the wire. However, as described above, since the rotation of the guide nozzle 16 moves the wire away from the feed line 31, the wire 12 is forwarded without any interference with the insert machine 4. FIG. 14 also shows the operation of the insertion of wire. In this operation, the wire component 12x in the form of bracket, for example, shown on the left side of the drawing, is mounted on the circuit board 11 with its opposite end inserted into the corresponding holes 19 formed in the board.

As described above, the wire mounting machine carries the wire feed operation and the wire insert operations simultaneously.

FIG. 15 shows an operation in which a distal end of the wire is transferred to the insert machine. That is, a distal end portion of the wire fed out near the insert machine in the previous wire feed operation is rotated horizontally about the support axis 15 in the direction D from a setback position (see FIG. 14) to a cut and bent position (see FIG. 15). In the cut and bent position, the wire stays on the feed line 31 in a straight manner. Since at this moment the previous wire component 12x has already been mounted on the circuit, the distal end of the wire 12 can be received without any trouble. After being received by the insert machine 4, the distal end of the wire is cut by the two pairs of blades 21 and 22 to form a piece of wire having a certain length. This completes the transfer of the wire 12 to the insert machine 4.

In the setback position in FIG. 17, for preparing the subsequent feeding of the wire, the guide nozzle 16 is rotated about the support shaft 15 in the direction indicated by arrow C. This prevents the guide nozzle 16 and the wire to be fed out in, the subsequent wire feeding from making any interference with the insert machine 4. In this condition, the piece of wire in the insert machine 4 is bent into the predetermined shape, e.g., bracket form. When bending, the bending dye 24 is protruded by a linkage not shown and, simultaneously with this, the insert guides 25 are moved down. This results in that the piece of cut wire is formed by the cooperation of the bending dye 24 and the insert guides 25 into the wire component 12x of the predetermined bracket shape, for example. Then, the process goes back to the operation shown in FIG. 14. As described above, the wire 12 is subject to the feeding, cutting, bending operations and inserting operations subsequently, so that the wire components are inserted in the holes 19 of the circuit board 11.

FIG. 18 shows operations carried out in the insert machine. As shown in the drawing, operations indicated within a right block are those carried out by the wire feeder 3 and operations indicated within a left block are those carried out by the wire insert machine 4. Also, operations within an overlap region of the blocks are those carried out by the cooperation of the wire feeder 3 and the wire insert machine 4. For example, the wire feed operation by the wire feeder 3 and the wire insert operation by the wire insert machine 4 are carried out simultaneously when no rotation of the wire insert machine 4 is needed for the positioning of the wire component.

Referring to FIGS. 19 to 26, discussions will be made to another insert operation accompanied by the rotational positioning by the wire insert machine 4. In this operation, as shown in FIG. 19 providing a process of wire feeding, the paired rollers 13 rotate to feed out a predetermined length of the wire 12. At this moment, the cutters 21 and 22 take a home position on the reference line 31. The guide nozzle 16, on the other hand, takes a setback position so that it makes no interference with the insert machine 4. This in turn allows the wire 12 to be advanced without any interference with the insert machine 4. As can be seen from the drawing, a portion of the wire being advanced between the guide nozzle and the rollers 13 is curved to a certain extent away from the reference line 31.

Referring to FIG. 20, in the subsequent transmission of the wire, the guide nozzle 16 is rotated about the support shaft 15 in the direction D so that the distal end of the wire fed out in the previous feeding is transferred to the wire insert machine 14. This results in that the distal end portion of the wire is positioned on the straight reference line 31. Then, in the subsequent cutting shown in FIG. 21, the distal end portion of the wire 12 received by the wire insert machine 4 is cut by the cutters 21 and 22 in the wire insert machine 4, forming a wire component of a predetermined length. This completes the transmission of wire.

Referring to FIG. 22 showing a setback operation of the guide nozzle, the guide nozzle 16 is rotated about the support shaft 15 in the direction C to a setback position in order to prevent the possible interference of the insert machine 4 not only with the guide nozzle 16 but also with the distal end portion of the wire to be fed out in the subsequent feeding of the wire. At this moment, the wire 12 is curved away from the reference line 13. On the other hand, the bending dye 24 is protruded by the linkage not shown and also the insert guides 25 are moved down, so that the distal end portion of the wire is bent to form the wire component 12x. After the completion of bending, the bending dye 24 is moved backward by the linkage. Also, in the subsequent positioning, as shown in FIG. 23, the insert machine 4 rotates about a rotational axis P so that the wire component 12x is positioned above the predetermined insert position. Then, as shown in FIG. 24, the opposite ends of the wire component 12x held by the insert guides 25 are inserted in the holes 19 of the circuit board 11 (see FIG. 13). At this moment, the insert machine 4 opposes to the guide nozzle 16, so that a feeding of the wire causes an interference between the insert machine 4 and the distal end portion of the wire 12. This means that it is not permitted to feed the wire in this condition.

As shown in FIG. 25, after the completion of the insertion of the wire component, the insert machine 4 is returned to its original position, allowing the insert machine 4 to receive the subsequent distal end portion of the wire 12. This also allows the wire feeder 3 to feed the wire without any interference between the wire 12 and the insert machine 4, as shown in FIG. 19. By the completion of the processes described above, the wire 12 is repeatedly fed out, cut and bent to form wire components. Each of the wire components mounted on the circuit board 11 with its opposite ends inserted in the corresponding holes 19 of the circuit board 11. FIG. 26 shows the insert operation of the wire components in which the insert machine 4 rotates for the positioning of the wire components. In this drawing, the operations carried out by the feeder 3 and the insert machine 4 are shown in the respective blocks surrounded by the dotted lines. Also, operations within an overlap region of the blocks are those carried out by the cooperation of the wire feeder 3 and the wire insert machine 4.

The above-described conventional insert operation and machine have several drawbacks. As described with reference to FIG. 24, the guide nozzle 16 opposes the insert machine 4 while the insert machine 4 is performing the positioning and inserting of the wire component 12x. This prohibits the subsequent feeding of the wire, which would otherwise cause the interference between the insert machine and the wire. Therefore, the wire feeder 3 is required to wait for a certain period indicated at "A" in FIG. 26 until the insert machine 4 returns its home position. Also, the subsequent wire feeding is initiated only after the insert machine 4 is returned to its home position, which in turn requires the insert machine 4 to wait for a certain period indicated at "B" in FIG. 26 until after the completion of the wire feeding. Namely, a cycle time of the operation in which the insert machine 4 is required to rotate for the positioning of the wire component 12x is greater than that of the operation in which no rotation is required for the insert machine 4. This reduces an efficiency of mounting of wire components of the machine. For example, the operation with rotation requires 0.18 seconds for each component while another operation without rotation requires 0.15 seconds. This means that the productivity of the operation with rotation is lower than that without rotation by about 20%.

SUMMARY OF THE INVENTION

Therefore, a purpose of the present invention is to provide a method and apparatus capable of carrying out the positioning and inserting of the wire component and the feeding of the component simultaneously irrespective of the necessity of the rotation of the insert machine, thereby improving the productivity of the insert apparatus.

Accordingly, an apparatus for mounting a wire component on a substrate has a feed device for feeding a wire a predetermined length intermittently, and an insert device for cutting the wire fed out by the feed device, bending the cut wire to form a wire component, rotating and positioning the wire component, and then inserting the wire component in a hole defined in the substrate. In particular, irrespective of a position of the insert device, the feed device feeds out the were in a direction where no interference would occur between the feed device and the insert device.

BRIEF DESCRIPTION OF THE DRAWINGS

FIGS. 1 to 6 are plan views of a feed device and an insert device incorporated in a mounting apparatus of the present invention, in which FIG. 1 shows a wire directed outside a rotational area or range of the insert device, FIG. 2 shows the wire extending beside the rotational area, FIG. 3 shows the wire extended beside the rotational area, FIG. 4 shows that the extended wire is transferred to the insert device, FIG. 5 shows that a distal end portion of the wire is cut, and FIG. 6 shows the wire is moved away from the insert device;

DETAILED DESCRIPTION OF THE PREFERRED EMBODIMENTS

Figure 1:
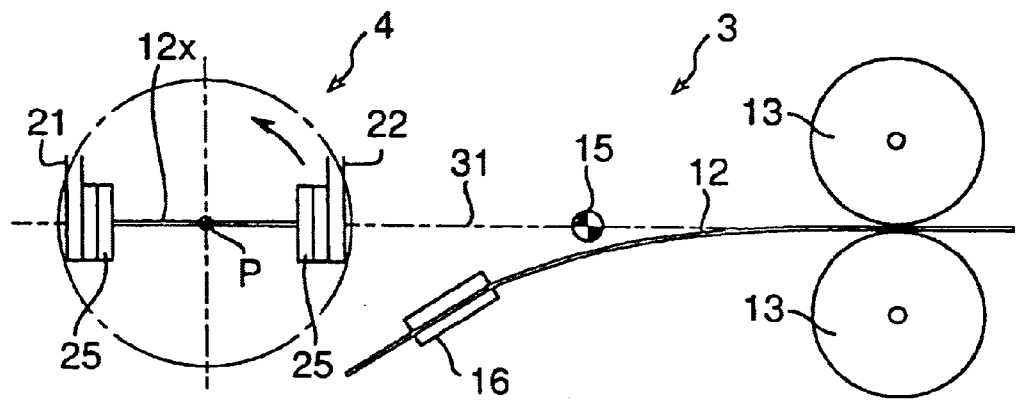

Referring to FIGS. 1 to 8, an apparatus for mounting wire components according to the embodiment of the present invention will be described hereinafter. Generally, the apparatus is similar to the conventional insert machine described-above, and therefore like parts bear like reference numerals throughout the drawings. Also, since the basic mechanical and operational construction of the apparatus of the present invention is almost the same as that of the conventional insert machine, no further description is made to the construction of the insert machine.

Figure 2:
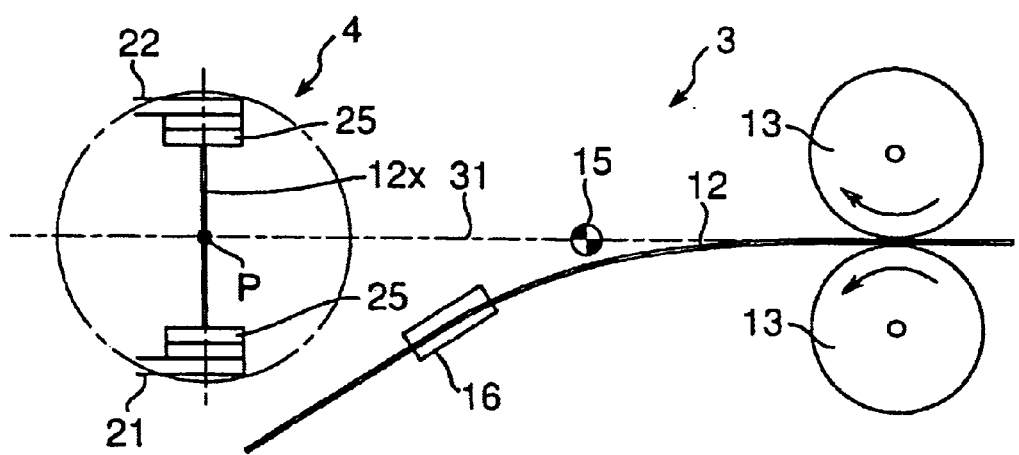

FIG. 1 shows the wire feeder 3 and the wire insert machine 4 of the apparatus for mounting wire components, in which a piece of wire for the wire component is held by the insert machine 4. In this condition, the wire nozzle 16 of the wire feeder 3 takes a setback position in which a portion of wire between the rollers 13 and the feed nozzle 16 is curved away from the reference line 31. Although the insert machine 4 receives a piece of wire, no rotation of the insert machine about the rotational axis P for positioning of the wire component has been initiated. Subsequently, as shown in FIG. 2, the insert machine 4 is rotated about the rotational axis P so that the piece of wire is oriented in the required direction for positioning. Next, the piece of wire is bent into a predetermined shape to form a wire component, which is then mounted on the circuit board with its opposite ends inserted in the holes of the circuit board. During these operations by the insert machine 4, the wire feeder 3 rotates the roller 13 for a predetermined period of time, so that a corresponding length of the wire 12 is forwarded through the guide nozzle 16. In this condition, the guide nozzle and the wire 12 are maintained outside a circle drawn by the outermost edge of the insert machine 4 at the rotation of the insert machine, indicated by long and short dotted line. As a result, the insert machine 4 does not interfere with the guide nozzle or the wire whichever direction the insert machine 4 is oriented to. This allows the positioning and/or the insertion of the wire component by the insert machine 4 and the feeding of wire by the wire feeder 3 to be carried out simultaneously.

Figure 3:
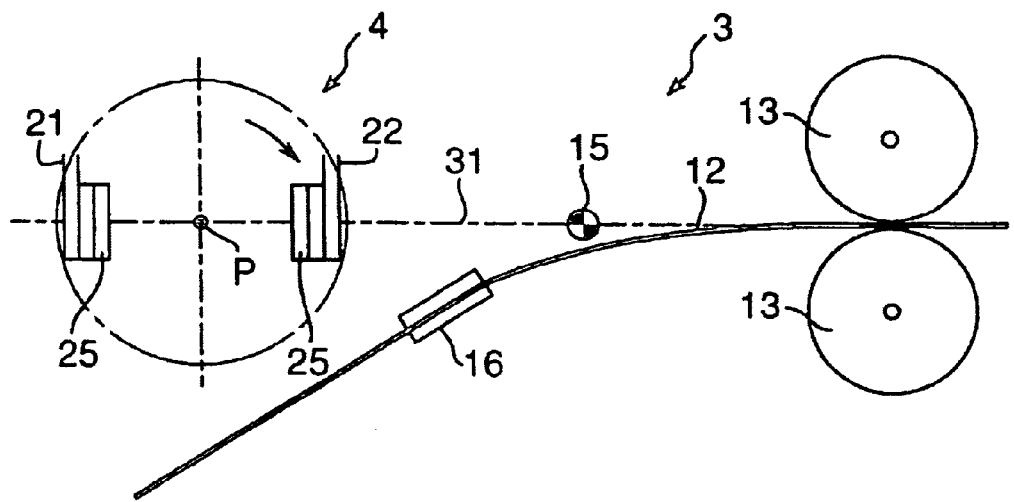
Figure 4:
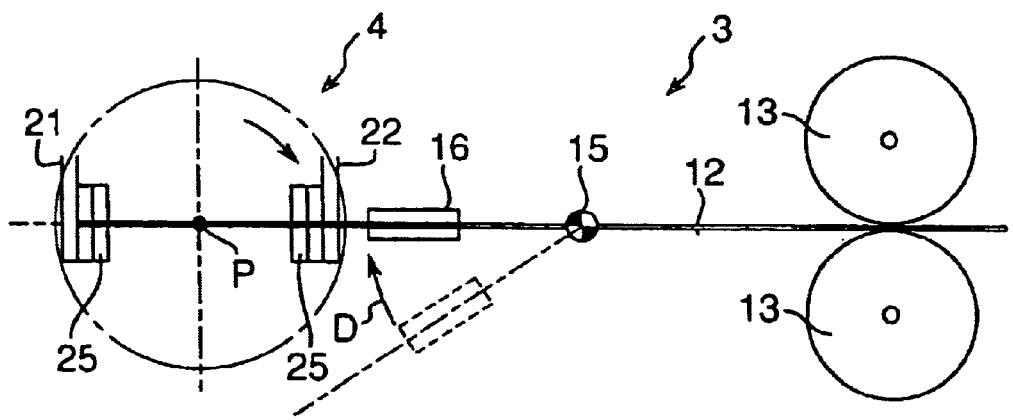

FIG. 3 shows the insert machine 4, which is returned to its home position after the completion of insertion and is ready for receiving the distal end of the wire. At this moment, the wire feeder 3 has already finished the feeding of the wire by rotation of the rollers 13, so that the predetermined length of wire 12 is extended out of the guide nozzle 16. From this condition, as indicated by FIG. 4, the guide nozzle 16 rotates about the support axis 15 in the direction D back to its home position where the wire 12 protruded from the guide nozzle 16 is brought into alignment with the reference line 31. This causes the portion of the wire protruded from the guide nozzle 16 to be received by the wire insert machine 4.

Figure 5:
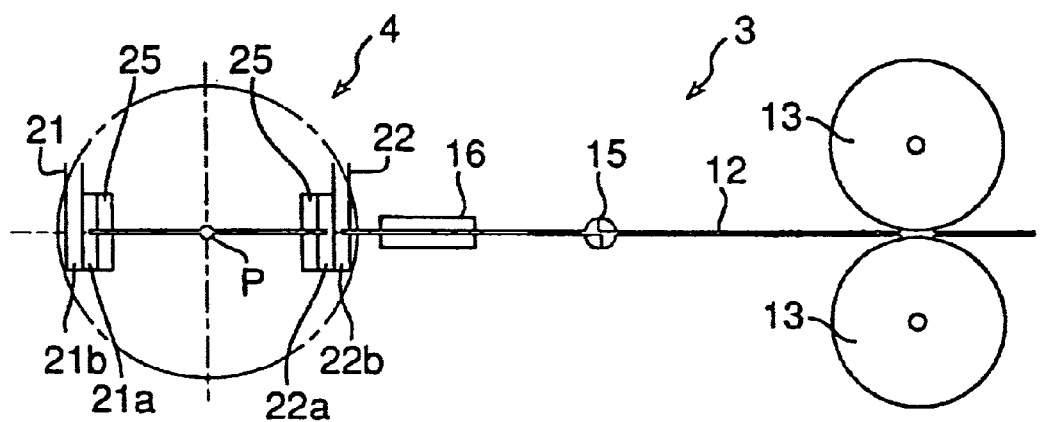
Figure 6:
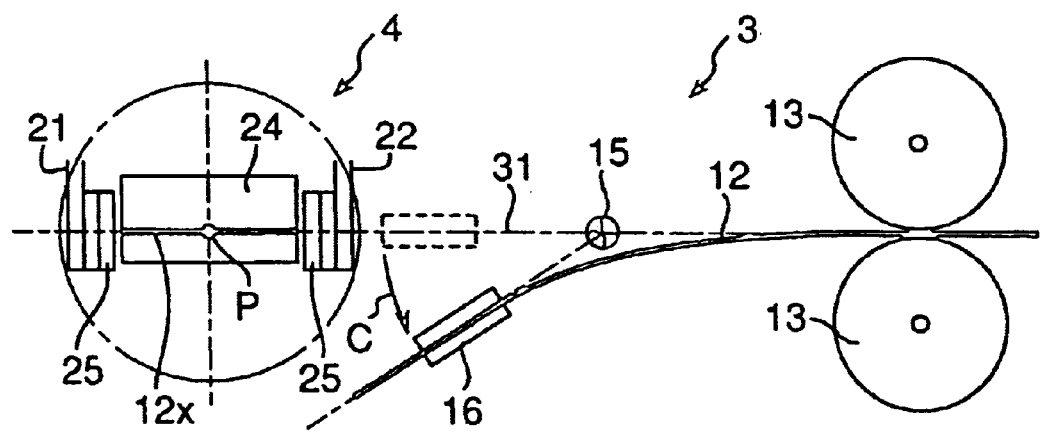

Then, as shown in FIG. 5, the movable blades 21a and 22a of the cutters 21 and 22 are moved downward to cooperate with the fixed blades 21b and 22b, respectively, cutting the distal portion of the wire 12 to form the piece of wire for the wire component. Next, as shown in FIG. 6, the guide nozzle 16 rotates about the support axis 16 in the direction C to the setback position where no interference is made between the insert machine 4 and the wire to be forwarded in the subsequent wire feeding. During this rotation of the guide nozzle 16, the insert guides 25 move downward relative to and cooperate with the bending dye 24 protruded by the linkage not shown, bending the wire piece to form the wire component 12x. After bending, the bending dye 25 is moved away to its home position by the linkage. Afterwards, the operations described above are repeated.

Figure 7:
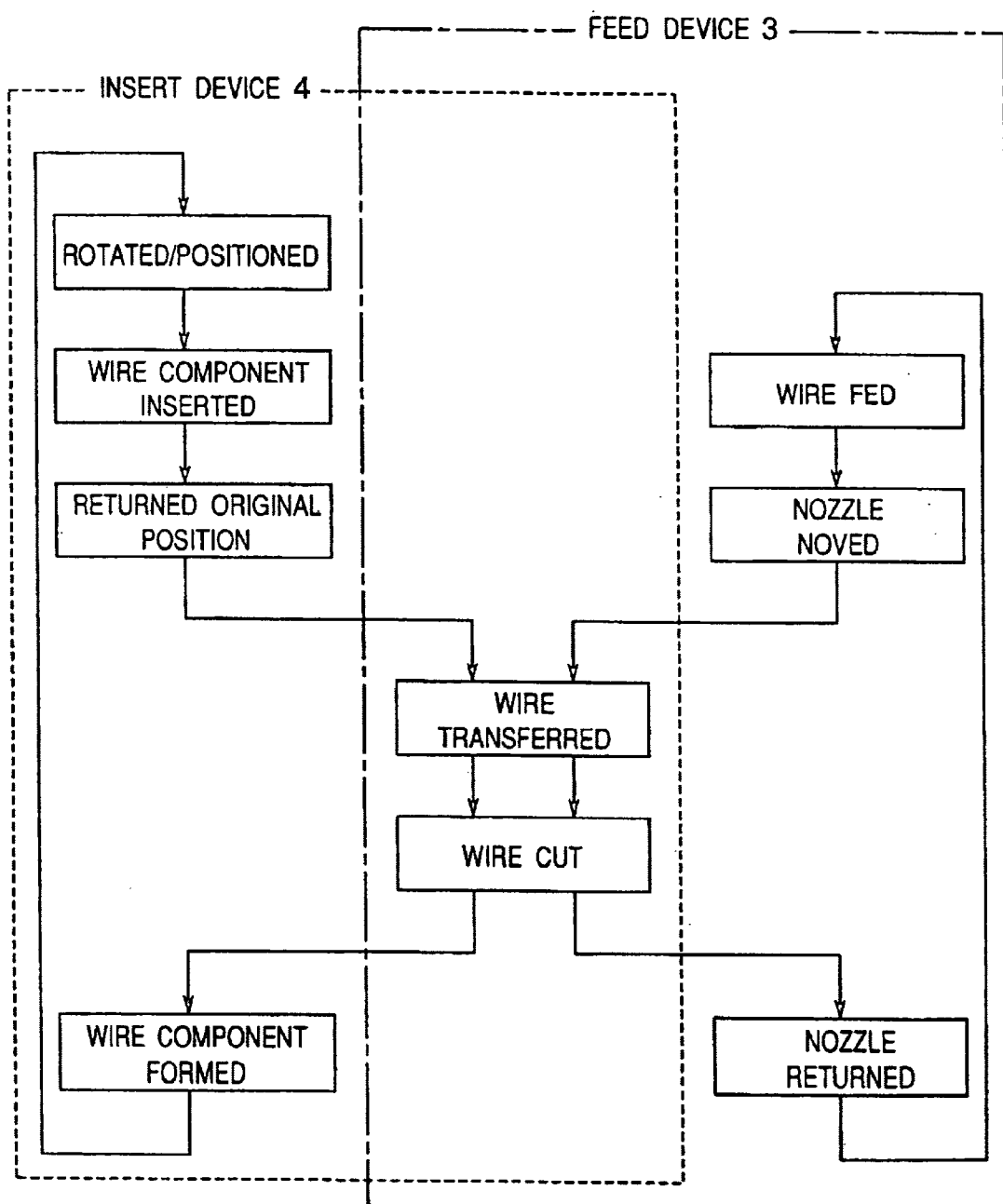
FIG. 7 is a diagram showing operations performed by the feed device and the insert device.

FIG. 7 shows the operations carried out by the wire feeder 3 and the wire insert machine 4. In this drawing, the operations carried out by the feeder 3 and the insert machine 4 are shown in the respective blocks surrounded by the dotted lines. Also, operations within an overlap region of the blocks are those carried out by the cooperation of the wire feeder 3 and the wire insert machine 4. As can be seen from the drawing, according to the embodiment of the present invention, the rotational positioning and insertion by the wire insert machine 4 can be carried out simultaneously with the feeding by the wire feeder 3, eliminating waiting times needed for the conventional wire insert machine. This reduces a cycle time for the insertion of the wire component and also increases the productivity of the machine.

Figure 8:
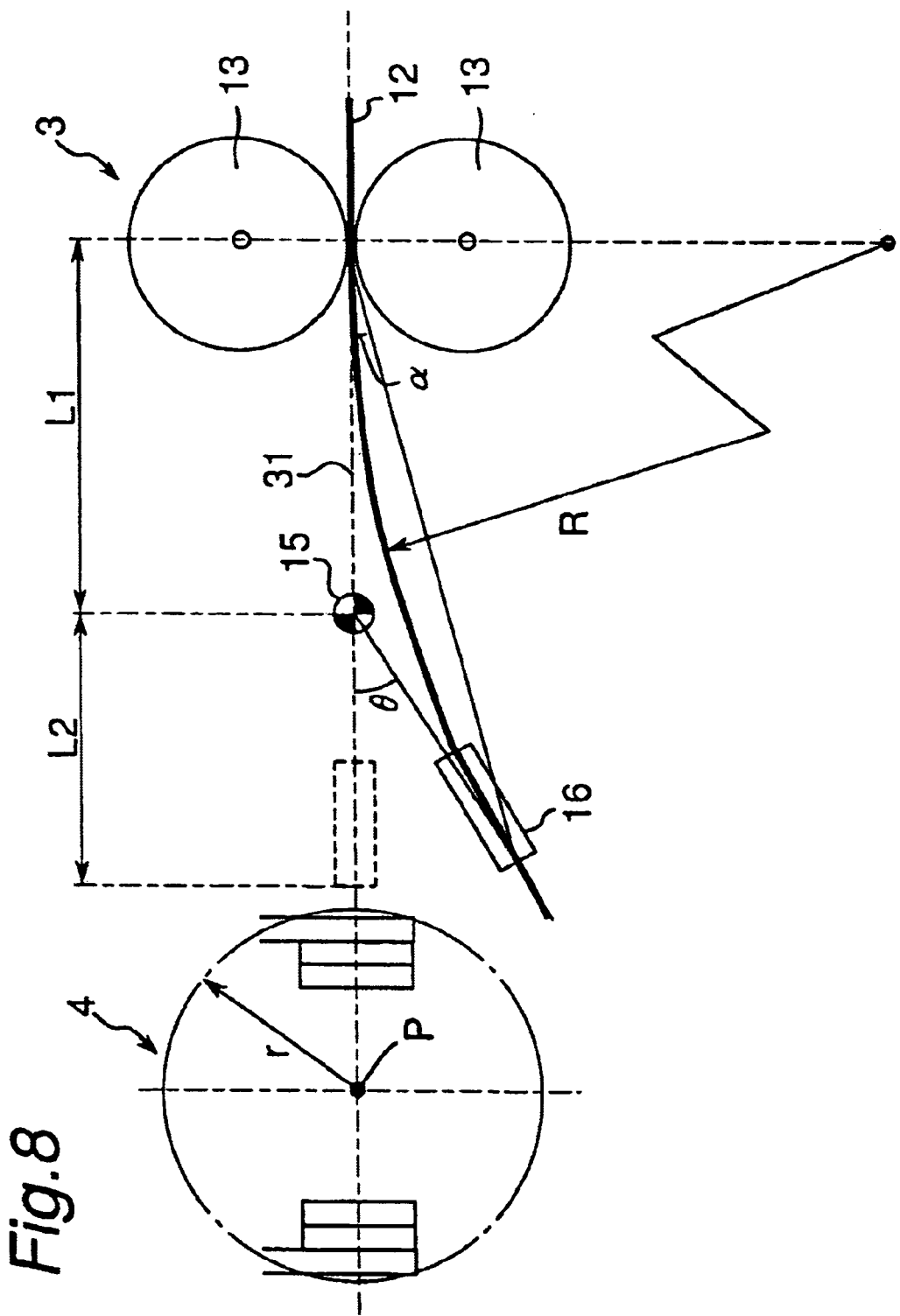
FIG. 8 is plan view of the feed device and the insert device of the mounting apparatus according to another embodiment of the present invention, showing a dimensional relation of the parts.

FIG. 8 shows a dimensional relationship of the wire feeder and the wire insert machine. Assume that both the rotational center or the support axis 15 of the guide nozzle 16 and the rotational axis P of the insert machine 4 are positioned on the reference line 31 along which the wire 12 is forwarded by the paired rollers 13. Also defined are distances as follows:

L1: Distance between a nipping center of the rollers 13 and the support axis 15;

L2: Distance from the support axis 15 to the distal end of the guide nozzle 15;

r: Radius of a circle drawn by the outermost end portion of the wire insert machine 4;

R: Radius of the portion of the wire curved between the rollers and the guide nozzle;

θ: Angle between the reference line 31 and the direction in which the guide nozzle 16 is oriented so that both the guide nozzle 16 and the distal end portion of the wire extending out of the guide nozzle 16 do not interfere with the wire insert machine 4; and α: Angle between the reference line 31 and the direction extending from the nip center of the rollers to the distal end of the guide nozzle 16.

For simplicity, supposing that distances L1 and L2 are 70 mm and the radius r is 55 mm. In this instance, if the angle θ is about 20° (as a result, the angle α is about 10°), no interference will occur between the insert machine 4 and the guide nozzle 16. In this condition, the radius R is given about 250 mm. A deformation of the wire 12 defined above stays within the elastic deformation of the wire made of copper having a diameter of 0.6 mm, for example, which is typically used as jump wires for the circuit board. Contrary to this, conventionally the angle θ of the guide nozzle 16 has been determined about 5°, for example, and the interference was avoided by prohibiting the feeding of the wire until when no interference would occur. However, in this embodiment the large angle θ is provided so that the guide nozzle 16 and the wire 12 are maintained at respective positions where the insert machine does not interference with the guide nozzle or the wire. This allows the insertion of wire to be carried out simultaneously with the wire feeding, which decreases the cycle time for wire mounting and increases the productivity of the machine.

It should be noted that the angles and dimensions described-above are one example and they are determined to avoid the interference of the guide nozzle and the wire with the insert machine. Also, typically a wire made of copper with a diameter of about 0.5–0.8 mm is used for the jump wire, though, the present invention is employed for various wires with different features. Preferably, in order to ensure the elastic recovering of the wire, a length of wire between the feed rollers 13 and the guide nozzle 16, i.e., L1+L2, is extended as long as possible.

Figure 12:
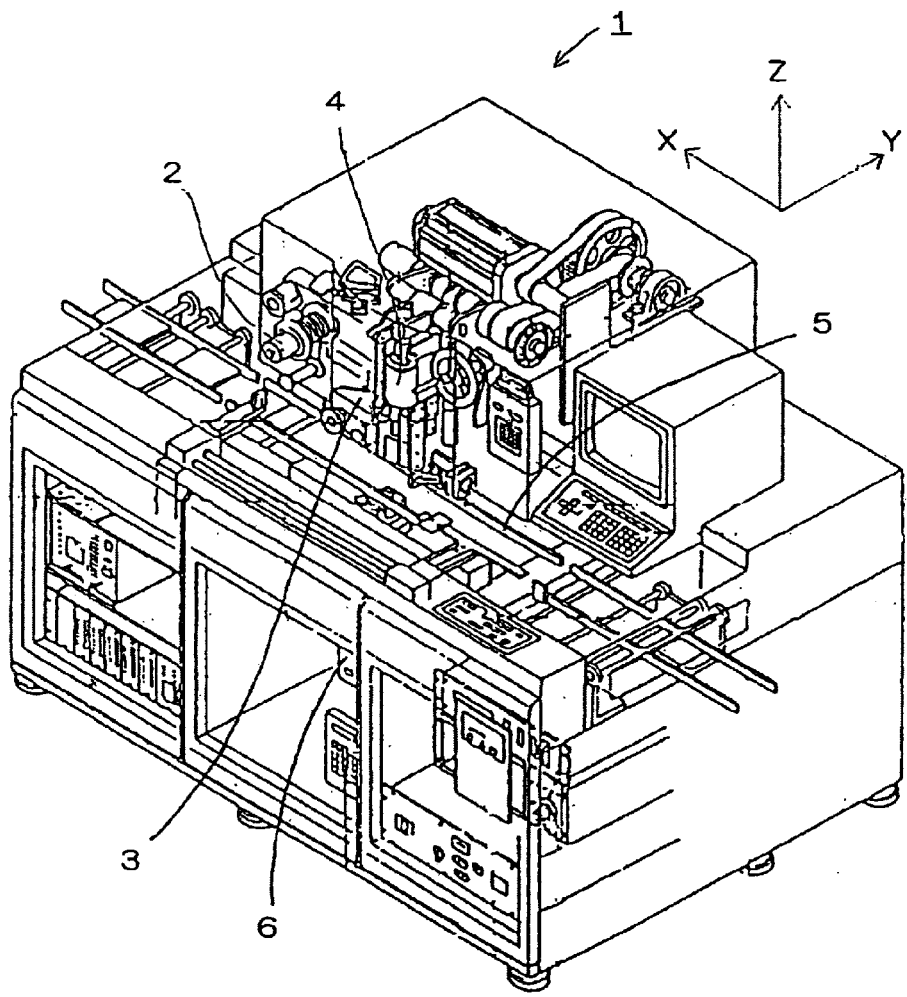
FIG. 12 is a perspective view of a conventional apparatus for mounting wire components.
Figure 13A:
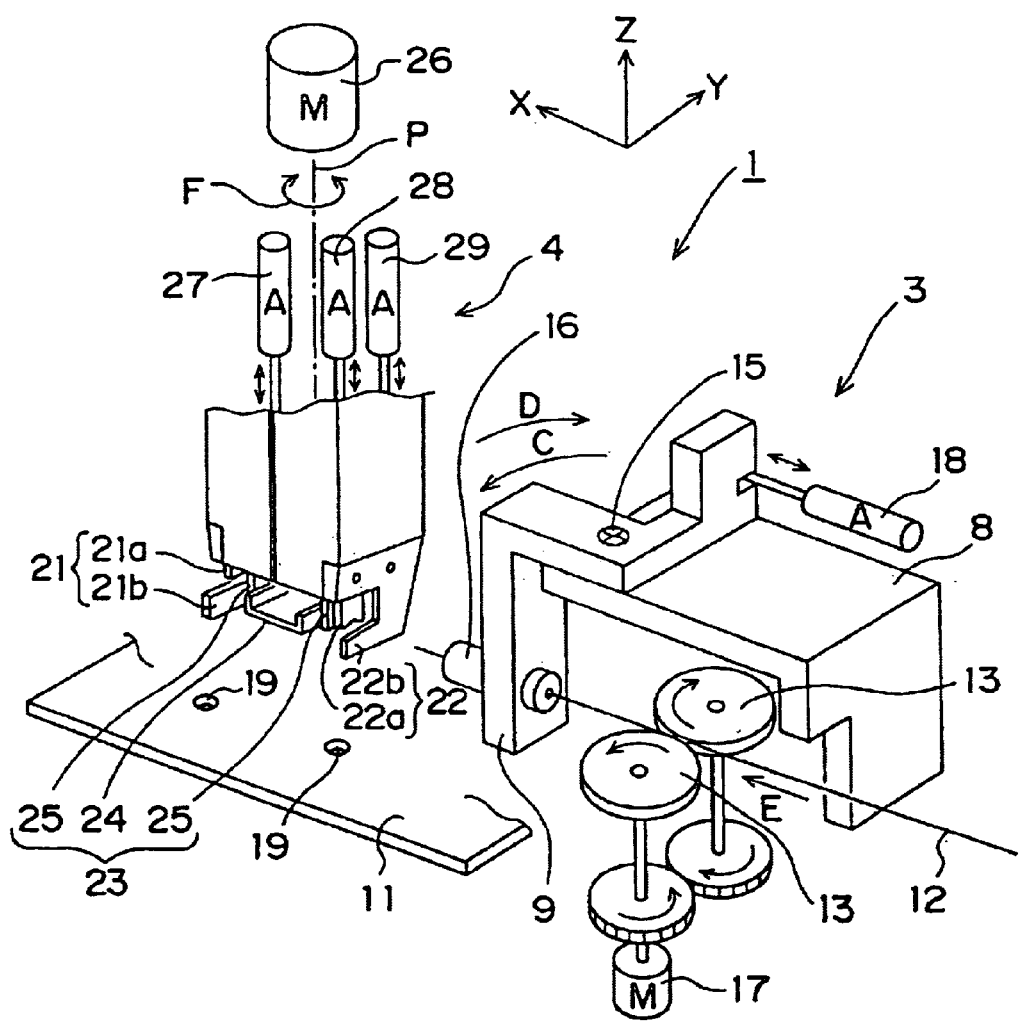
FIG. 13A is a perspective view of the feed device and the insert device in the apparatus in FIG. 12.
Figure 13B:
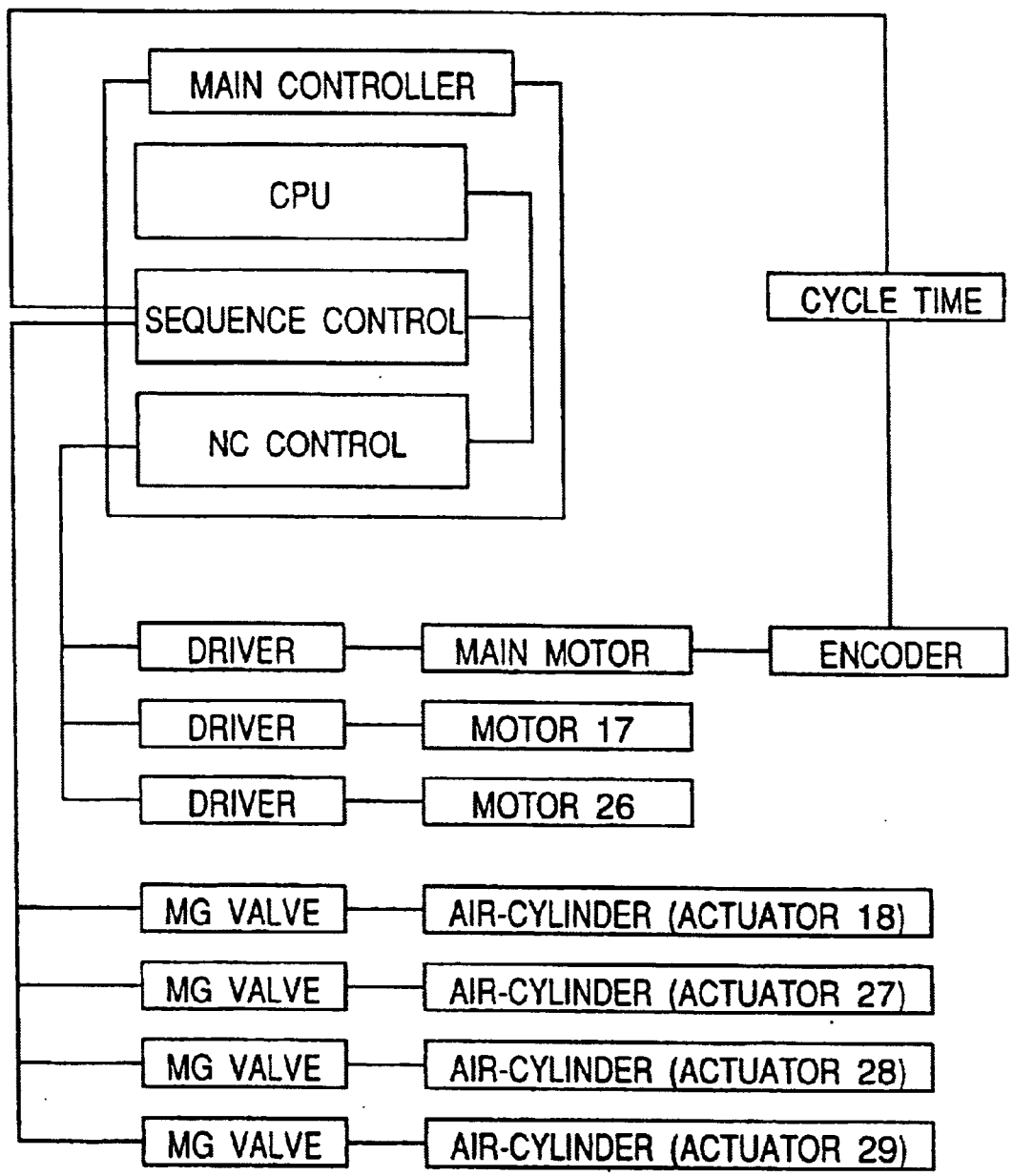
FIG. 13B is an operational diagram showing portions of the mounting apparatus.
Figure 14:
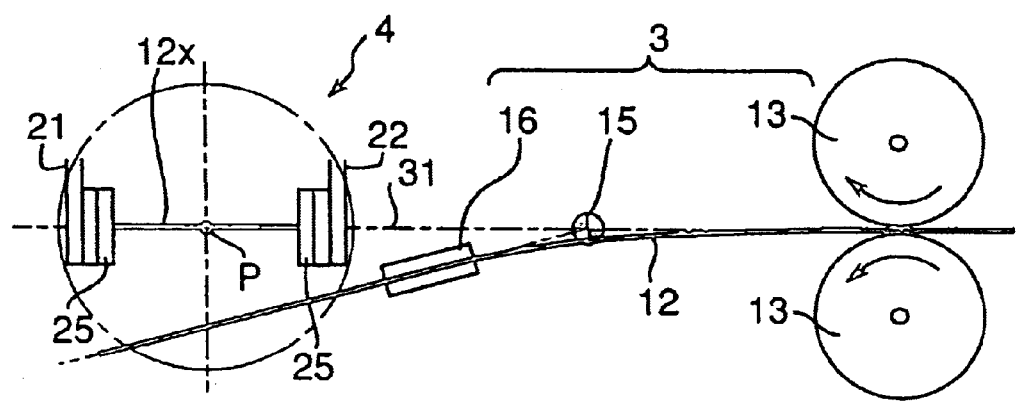
FIGS. 14 to 17 are plan views of the feed device and the insert device of the conventional mounting apparatus for describing its operations.
Figure 15:
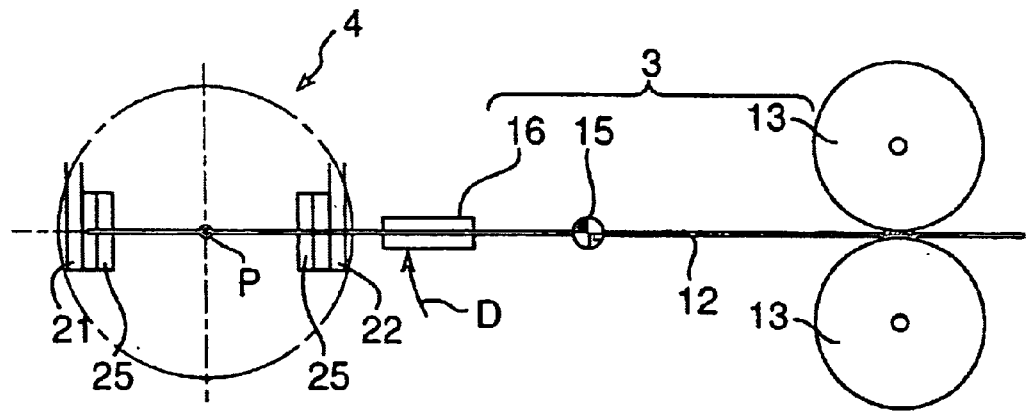
Figure 16:
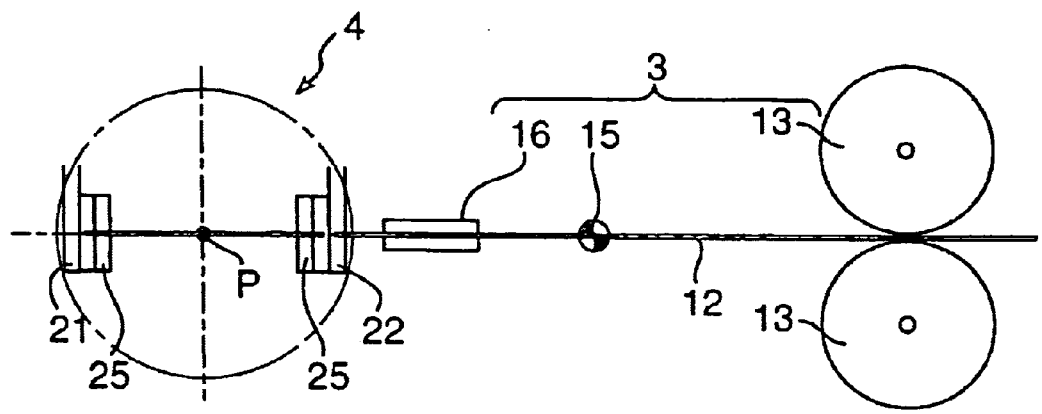
Figure 17:
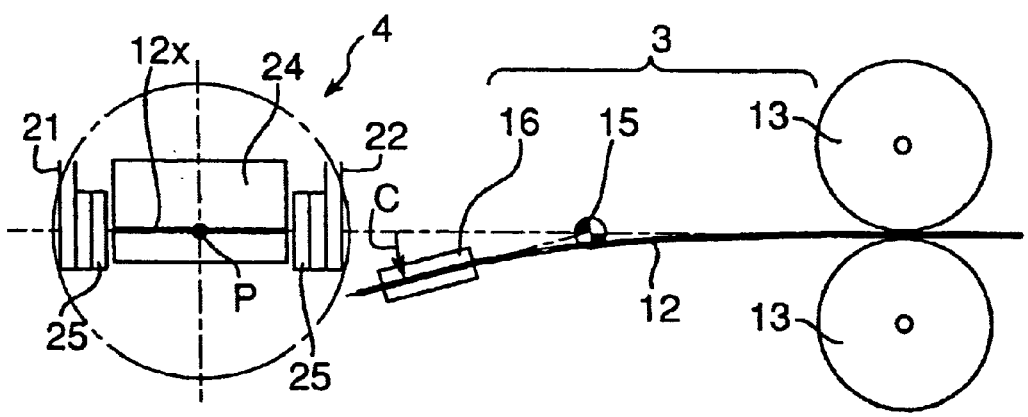
Figure 18:
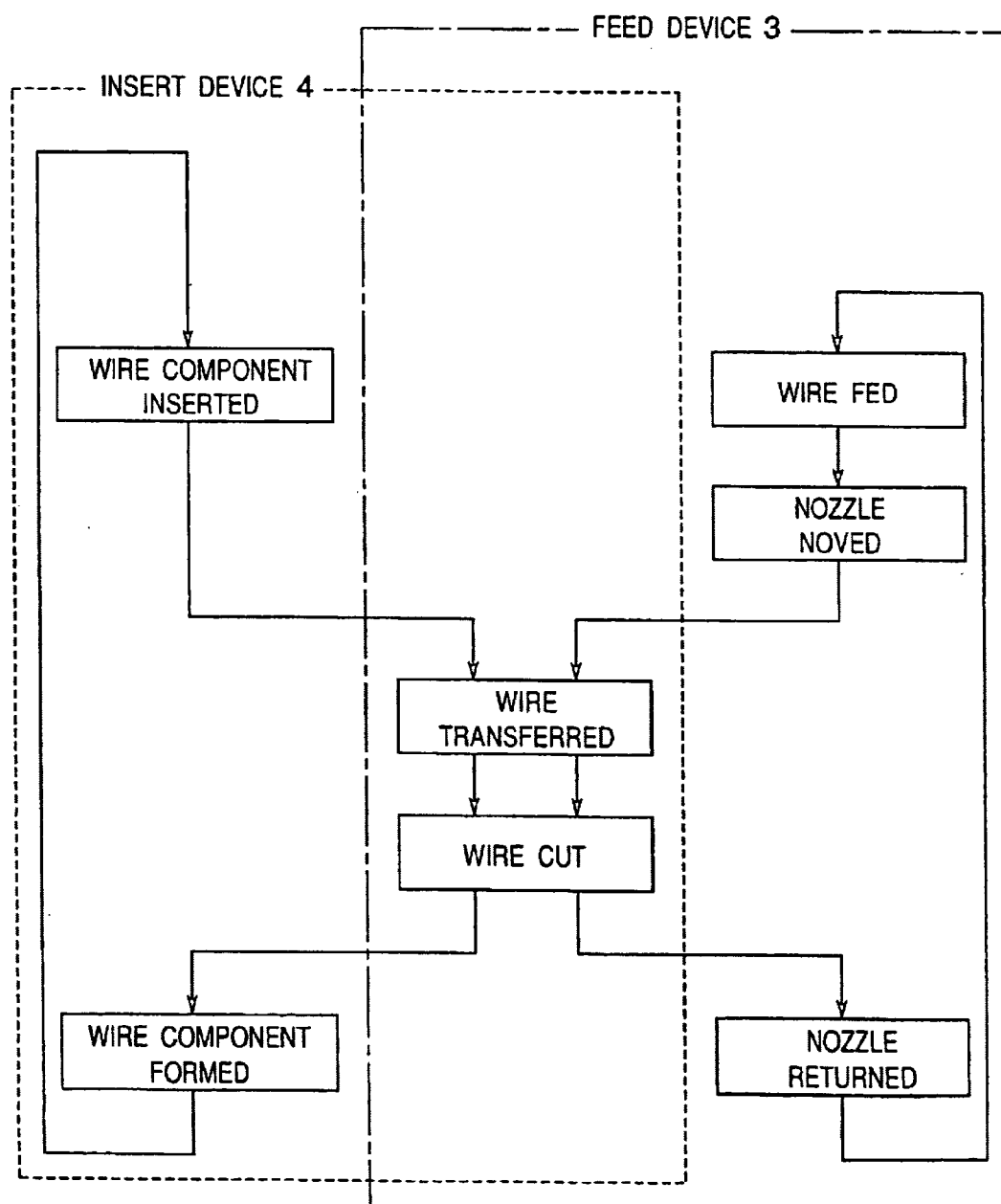
FIG. 18 is a diagram showing operations performed by the feed device and the insert device in the conventional mounting apparatus.
Figure 19:
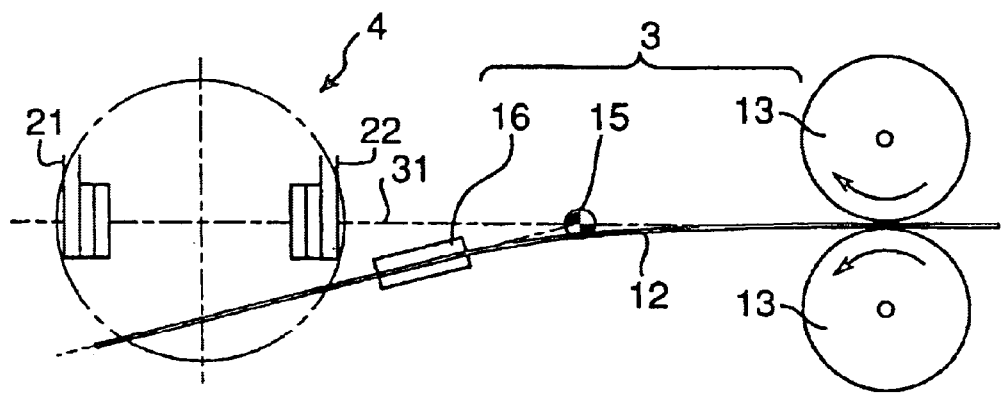
FIGS. 19 to 25 are plan views of the feed device and the insert device of the conventional mounting apparatus for describing its operations.
Figure 20:
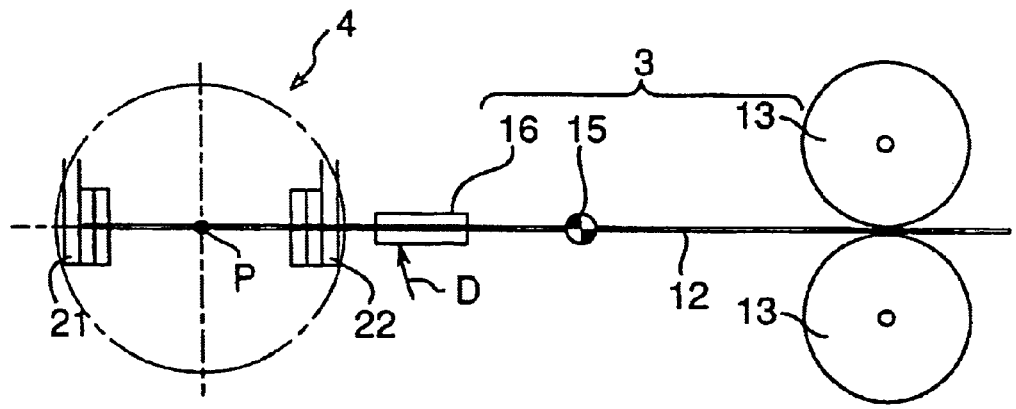
Figure 21:
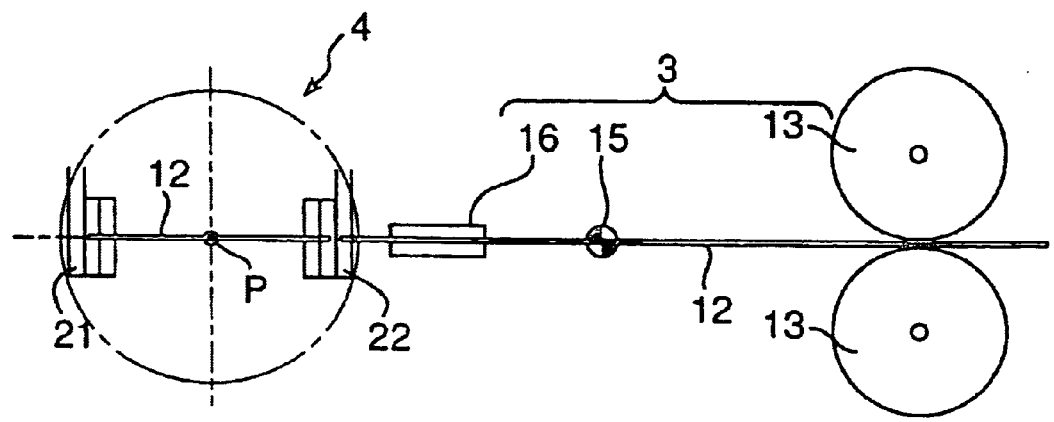
Figure 22:
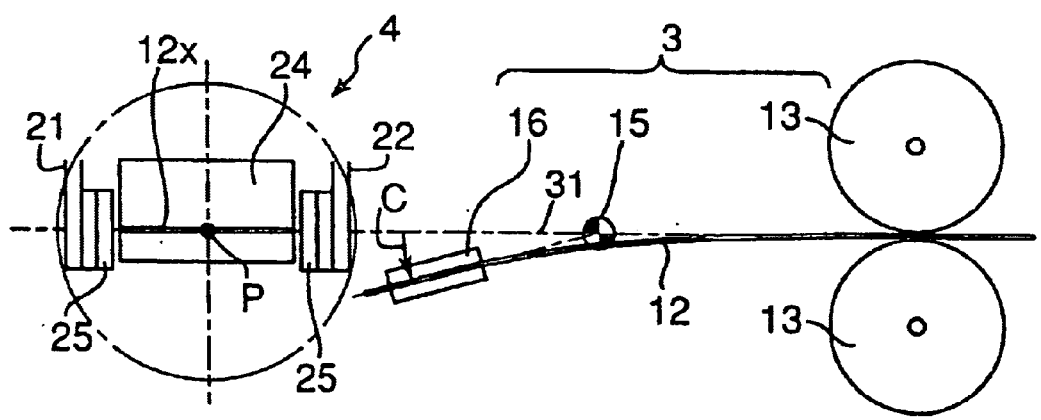
Figure 23:
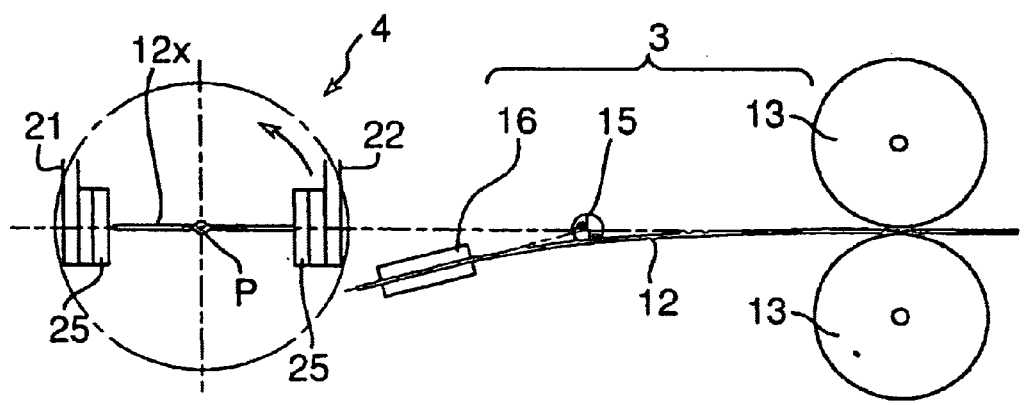
Figure 24:
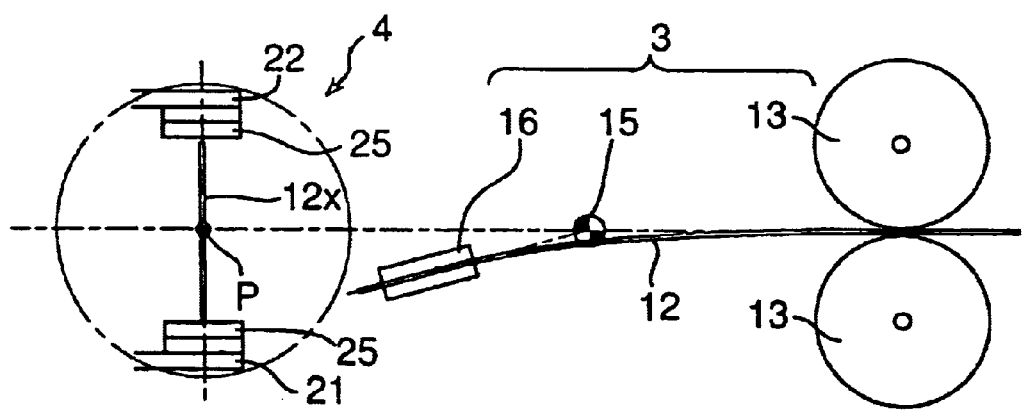
Figure 25:
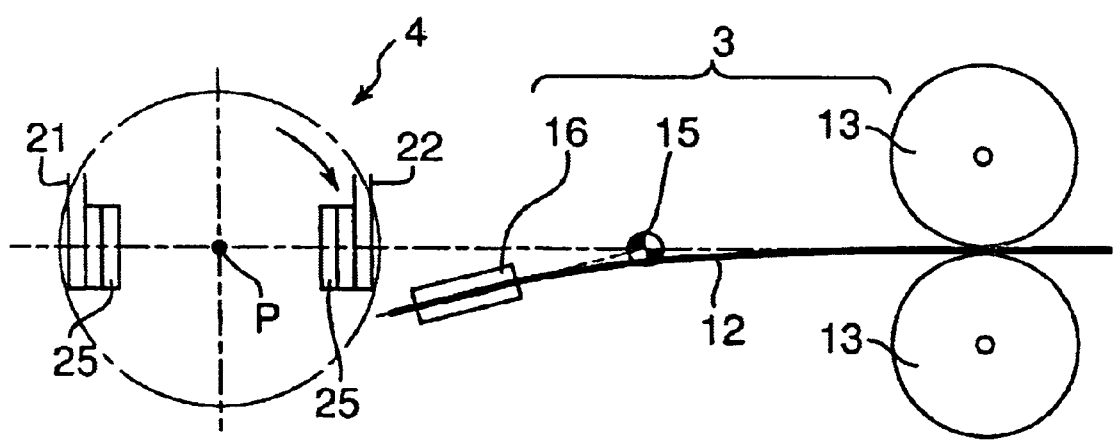
Figure 26:
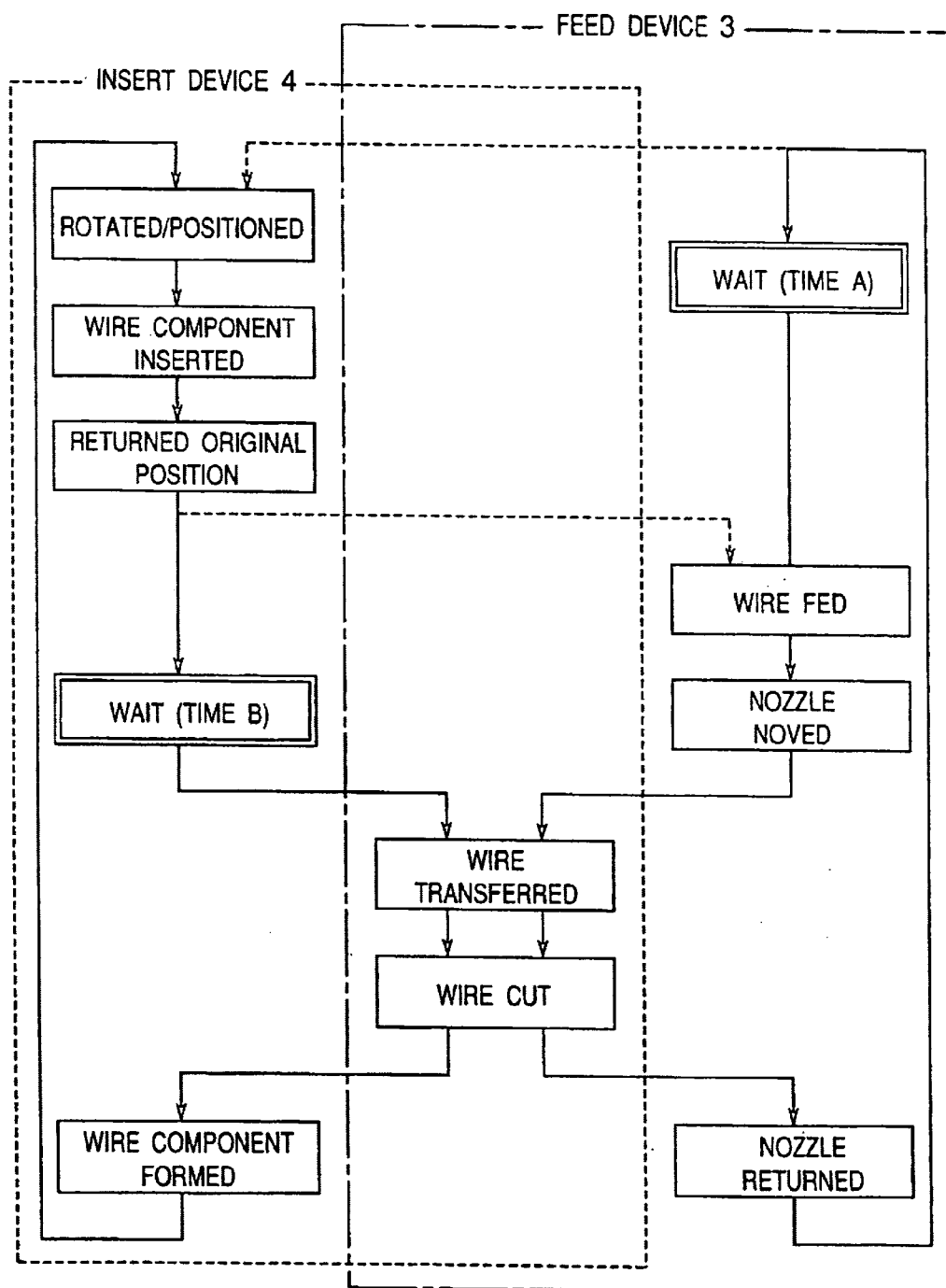
FIG. 26 is a diagram showing operations performed by the feed device and the insert device in the conventional mounting apparatus.

In the previous embodiment described with reference to FIGS. 1 to 6, the guide nozzle 16 is rotated to avoid any interference with the insert machine 4. However, there may be a situation in which the insert machine 4 is not rotated for positioning of the wire component or the positioning can be made with a slight rotation of the insert machine. In this instance, it is sufficient to move the guide nozzle 16 to an extent that the guide nozzle 16 does not interfere with the insert machine 4 located in its home position or slightly rotated for positioning. Therefore, the controller 6 (see FIGS. 12 and 13B) controls the rotational angle of the guide nozzle 16 depending upon the insert position of the wire component 12x, minimizing the rotation of the guide nozzle 16 and decreasing a time therefor.

SECOND EMBODIMENT

Figure 9A:
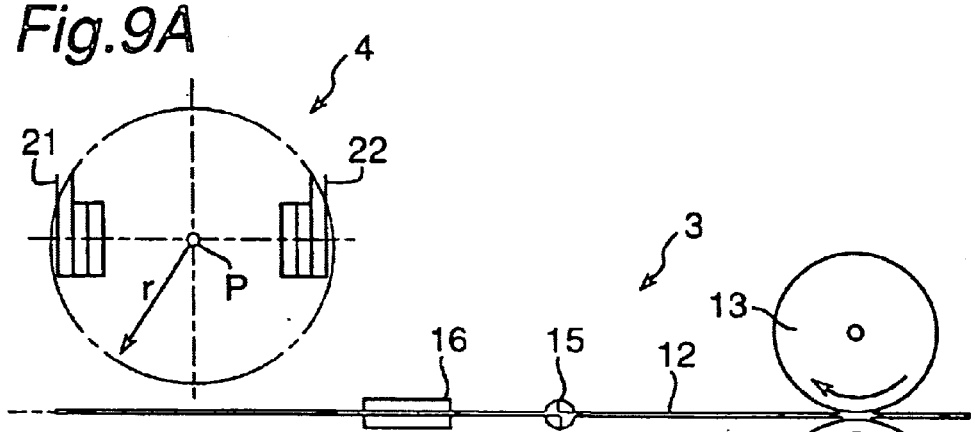
FIGS. 9A to 9C are plan views of the feed device and the insert device of the mounting apparatus according to another embodiment of the present invention, in which the insert device is spaced away from a reference line along which the wire is extended by the feed device.
Figure 9B:
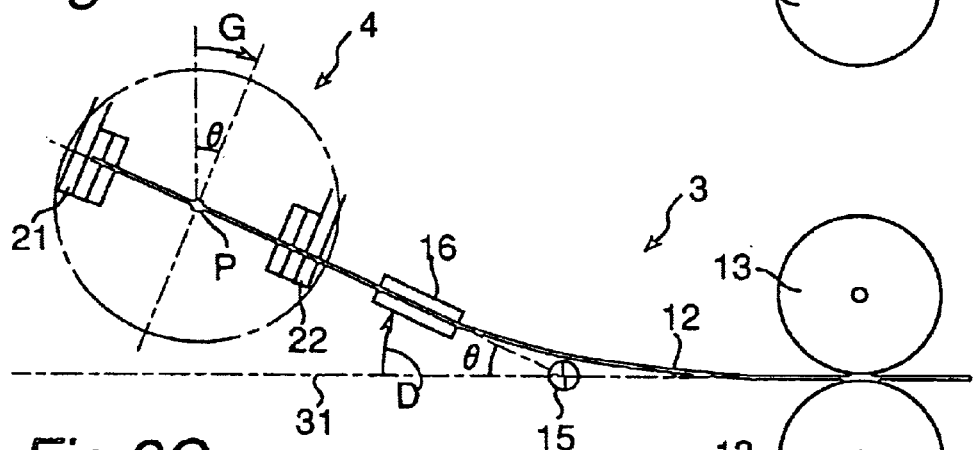
Figure 9C:
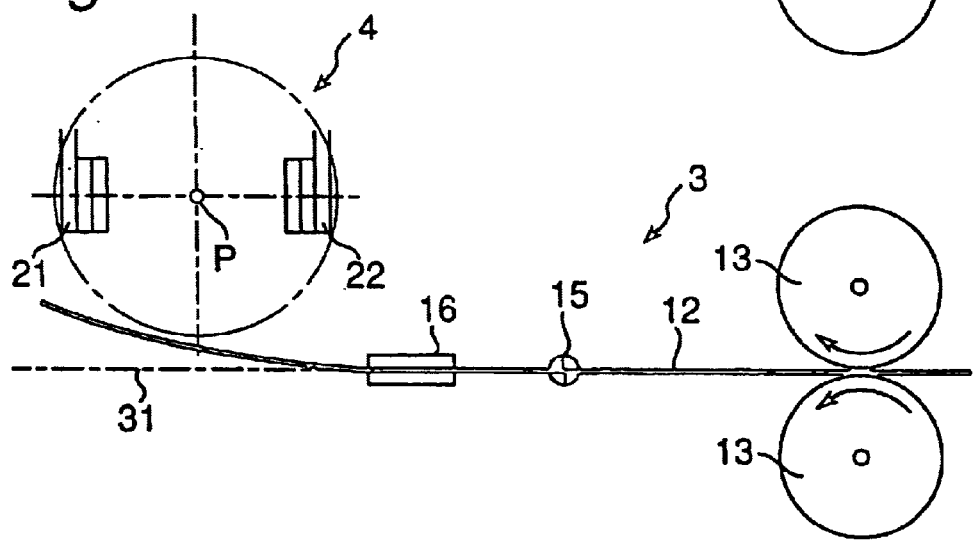

FIGS. 9A to 9C shows a second embodiment of the present invention, in which the insert machine 4 is positioned away from the reference line 31. For example, the rotational center P of the insert machine 4 is spaced more than its radius "r" away from the reference line 31. As shown in FIG. 9A, this allows the feed rollers 13 to feed the wire 12 straightly along the reference line. Then, as shown in FIG. 9B, the guide nozzle 16 is rotated about a certain angle θ (e.g., 20°) to move the distal end of the wire toward the insert machine 4. Preferably, at this moment, in order to receive the distal end of the wire, the insert machine 4 is rotated by about angle θ. Then, after the completion of the cutting operation, the guide nozzle 16 is returned to its home position and the wire is forwarded as shown in FIG. 9C. Although not shown, the wire piece is bend into the wire component which is then mounted on the circuit board.

According to the second embodiment of the present invention, the wire is forwarded straightly and then smoothly through the guide nozzle without providing any possible damage on the plated surface of the wire 12, which might be caused by its frictional contact with the guide nozzle 16. Also ensured is that the driving mechanism of the rollers 13 for feeding wire suffers from a reduced load, which results in a smooth feeding of the wire.

THIRD EMBODIMENT

Figure 10A:
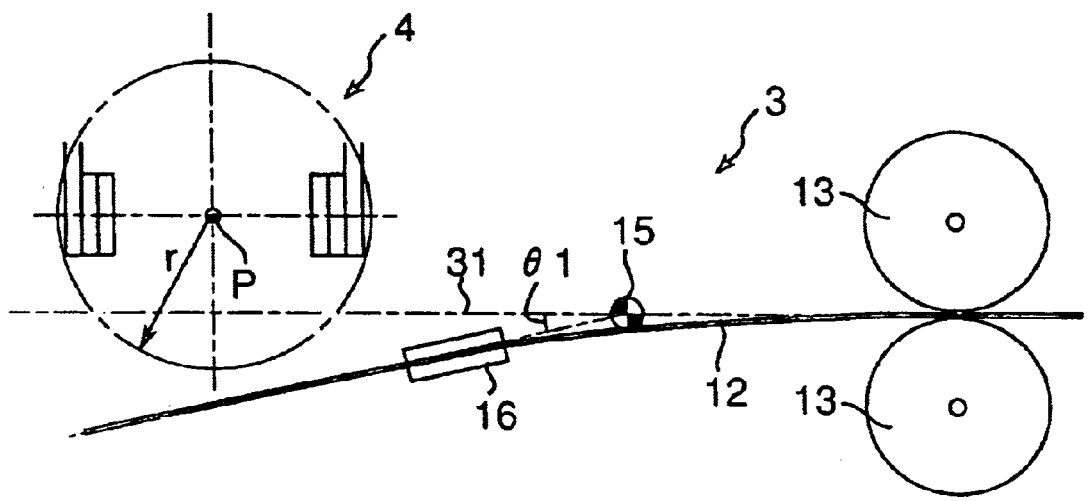
FIGS. 10A and 10B are plan views of the feed device and the insert device of the mounting apparatus according to another embodiment of the present invention, in which the reference line crosses a mid-portion of a rotational radius of the insert device.
Figure 10B:
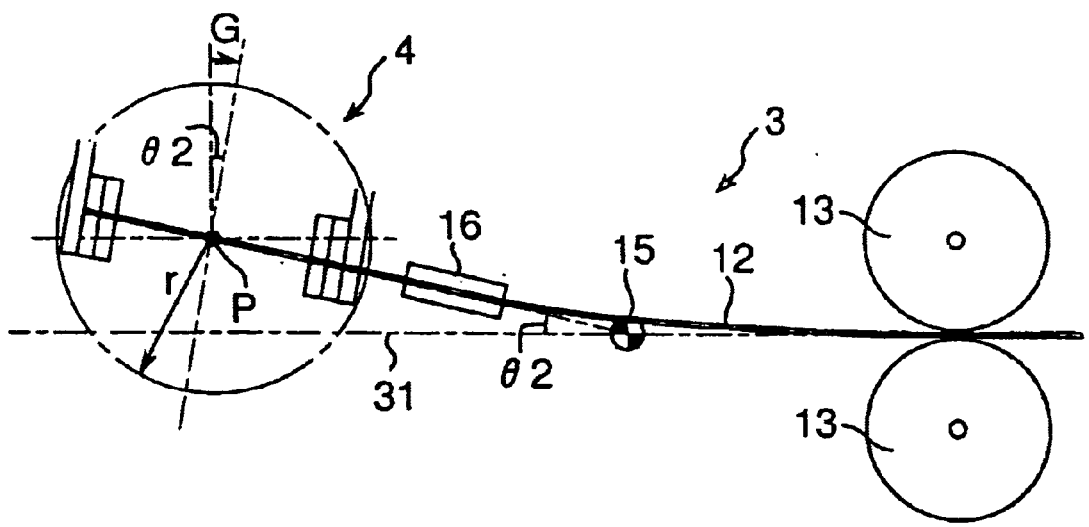

FIGS. 10A and 10B show a third embodiment of the present invention, in which the insert machine 4 is located between two positions taken in the first and second embodiments, respectively, so that the reference line 31 crosses a rotational area of the insert machine 4. For example, the insert machine 4 is positioned so that the reference line 31 crosses a position spaced a half radius, i.e., r/2, away from the rotational center P of the insert machine 4.

With the arrangement, as shown in FIG. 10A, in the operation of wire feeding, the guide nozzle 16 is rotated about θ1 away from the reference line 31 so that no interference would occur with the insert machine 4. Then, as shown in FIG. 10B, in the wire transfer operation, the guide nozzle 16 and the wire extended out of the guide nozzle 16 are rotated θ2 in the opposite direction so that the insert machine 4 can receive the distal end portion of the wire. At this moment, the insert machine 4 is preferably rotated about θ2 in the direction G relative to the reference line 31 in order to ease the wire transfer. Although not shown in FIG. 10, other operations for returning the guide nozzle cutting the wire and inserting the wire component are the same as those described in connection with the first embodiment.

According to this embodiment, the rotational angle θ1+θ2 of guide nozzle 16 required for preventing the possible interference of the guide nozzle 16 and the wire 12 with the insert machine 4 is substantially equal to the angle θ required in the first and second embodiments. However, the deformation of the wire 12 is smaller than those required in the first and second embodiments. For example, if the distance between the rotational center P of the insert machine 4 and the reference line 31 is about r/2, the deformation of the wire in this embodiment is reduced to one half, i e.,θ1=θ2=θ/2, of that required in the first and second embodiments. Comparing with the first embodiment, the wire is forwarded more smoothly by the rollers 13. Also, the conditions determined by the plastic deformation of the wire are eased considerably, compared with the first and second embodiments. In particular, the reduction of the deformation angle of the wire allows the guide nozzle 16 to be arranged more close to the feed rollers 13, which minimizes the size of the machine. Also, the large size wire can also be forwarded while preventing its plastic deformation.

Although, as shown in FIGS. 10A and 10B, the guide nozzle 16 is rotated away from the reference line 31 before the wire is extended out of the guide nozzle 16, if it is unnecessary for the insert machine 4 to rotate for positioning or the wire insertion can be permitted by a slight rotation of the insert machine, the wire can be fed out of the guide nozzle while maintaining the guide nozzle 16 on the reference line 31. This results in a smooth feeding of the wire 12 by the rollers 13 and eliminates a time for rotating the guide nozzle 16.

FOURTH EMBODIMENT

Referring again to FIG. 9, a fourth embodiment of the present invention will be described below. Although, in the embodiments described above, the wire is deformed or bent within its elastic zone, there are certain cases where a slight plastic deformation thereof is not problematic to the wire insertion.

In the following embodiments, the wire is deformed to its plastic zone. Referring to FIGS. 9A to 9C, it is assumed that, after feeding the wire 12 as shown in FIG. 9A, the guide nozzle 16 rotates more than about θ=25° to bend the wire with a radius of curvature of about 200 mm for the transfer of the wire to the insert machine 4 as shown in FIG. 9B, which results in a plastic deformation of the wire 12. This also results in that, as shown in FIG. 9C, the distal end portion of the wire 12, if it would be fed out from the guide nozzle 16 subsequently located on the reference line 31, extends and curves away from the reference line 31 due to its plastic deformation.

It should be noted that although the curved wire is exaggerated in FIG. 9C, the typical length of the main straight portion of the wire component ranges from 5 to 25 mm. Therefore, the wire component bent with the radius of curvature of about 200 mm has substantially the same length of the unbent wire component. Also, a difference of the length between the bend wire component and the unbent wire component, if any, is very small, which never provide a critical problem to the mounting of the wire component. Even, the plastic deformation of the wire 12 will be decreased when it is released from the guide nozzle 16 due to its spring back feature.

In addition, the wire 12 curved toward the insert machine 4 as shown in FIG. 9C may result in an advantageous transfer of the wire to the insert machine 4. In this instance, in the operation of the wire transfer, the distal portion of the wire away from the guide nozzle 16 contacts with one cutter 21 of the insert machine and then the proximal portion of the wire adjacent to the guide nozzle 16 contacts with the other cutter 22 of the insert machine. Between the first and second contacts of the wire portions with the cutters 21 and 22, a portion of the wire therebetween is forced toward the rotating direction, eliminating the plastic deformation of the wire and thereby causing the wire component to have a predetermined length.

Figure 11A:
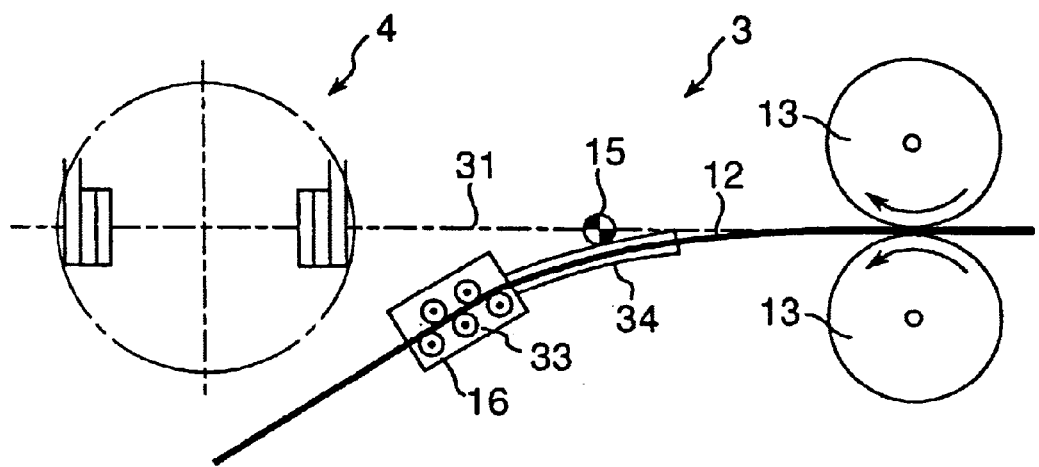
FIGS. 11A and 11B are plan views of the feed device and the insert device of the mounting apparatus according to another embodiment of the present invention, in which the guide nozzle has a plurality of rollers arranged in a staggered fashion and a guide tube located between the feed rollers and the guide nozzle.
Figure 11B:
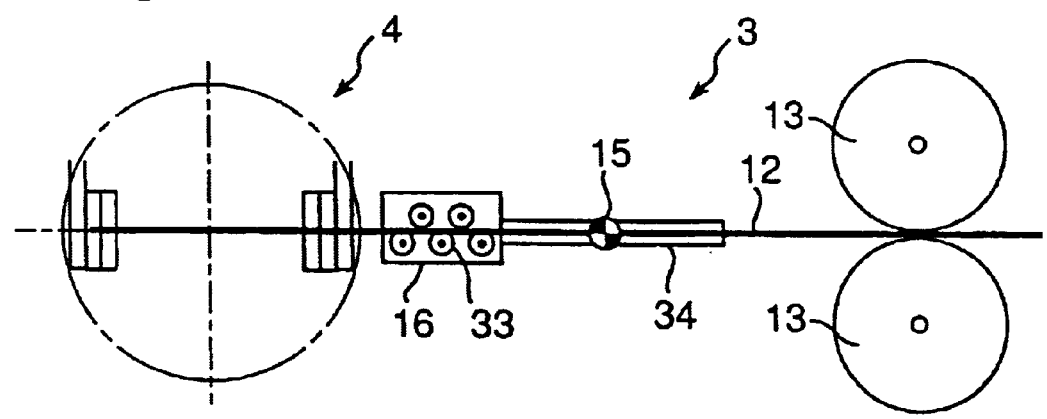

FIGS. 11A and 11B show a fifth embodiment of the present invention, in which the portion of the wire extended out from the guide nozzle in the plastic condition. For example, the guide nozzle 16 has a straightening device 33 made of a plurality of rollers arranged in a staggered fashion. With the arrangement, the wire 12 is fed out from the feed rollers 13 where it is deformed in part in a plastic manner. The wire 12 is then advanced through the guide nozzle 16 where it is further deformed in the opposite direction in a plastic manner by the straightening device 33, removing the plastic deformation to straight the portion of wire fed out from the guide nozzle 16.

Accordingly, the guide nozzle 16 with the straightening device 33 allows the guide nozzle 16 and the wire 12 to be rotated to prevent them from making any interference with the insert machine 4 without considering the rotational restriction determined, for example, by the elastic range of the wire 12.

A guide tube 34 may be provided between the rollers 13 and the straightening device 33 in order to prevent the wire 12 from buckling which night be caused by an axial resistance received at entering into the straightening device 33. The guide tube 34 is preferably made from a tube or sheath typically used for wire cables, for example, capable of curving according to the bending of the wire but preventing the buckling of the wire 12. The rollers of the straightening device 33 may be connected with a motor not shown for pulling the wire 12 between the rollers in synchronous with the feed rollers 13. This is more preferably to the feeding of the wire having a small diameter so that it is likely to buckle by the resistance of the rollers. The guide tube as well as the straightening device 33 may also be used in the previous embodiments in which the wire 12 is advanced without causing a plastic deformation thereof.

As described above, according to the apparatus and method for mounting wire components of the present invention, the rotational positioning and inserting of the wire by the insert machine can be done simultaneously with the feeding of wire by the wire feeder irrespective of the insert position of the wire. This reduces a cycle time for mounting of the wire components, increasing the availability factor and the productivity of the apparatus.

Also, although the wire may be plastically deformed, an amount of deformation is not critical to the subsequent operations such as insertion or the function of the wire. Further, the plastic deformation can be removed by the straightening device, which would not provide adverse affect to the simultaneous operations.

It should be noted that this application is base upon Japanese Patent Application No. 2000-315241, the disclosure of which is hereby incorporated by reference in its entirety.

What is claimed is:

1. An apparatus for mounting a wire component onto a substrate, comprising:
    a feed device for intermittently feeding a wire a predetermined distance, said feed device being constructed and arranged to move between a first position at which the wire is to be fed the predetermined distance so as to provide a fed-out predetermined length of wire and a second position at which the fed-out predetermined length of wire is to intersect a predetermined axis; and an insert device for receiving and cutting the fed-out predetermined length of wire into a cut portion of wire, rotating the cut portion of wire, and then inserting the cut portion of wire into a hole in a substrate, said insert device being constructed and arranged to rotate about the predetermined axis, so that an outer edge of said insert device defines a circle, between a third position at which said insert device is to insert the cut portion of wire into the hole in the substrate and a fourth position at which said insert device is to receive the fed-out predetermined length of wire, wherein when said feed device is in the first position the fed-out predetermined length of wire is outside the circle defined by the outer edge of said insert device.

2. The apparatus according to claim 1, wherein said feed device is also constructed and arranged such that when said feed device is in the first position or the second position the wire is bent within its elastic range.

3. The apparatus according to claim 1, wherein said feed device is also constructed and arranged such that when said feed device is in the first position or the second position the wire is bent beyond its elastic limit.

4. The apparatus according to claim 1, wherein said feed device is also constructed and arranged such that an amount of bending of the wire is varied according to positioning rotation of the wire.

5. The apparatus according to claim 1, wherein said feed device includes
   (i) a feed mechanism for intermittently feeding the wire the predetermined distance, and
   (ii) a first guide tube for guiding the wire fed by said feed mechanism, said first guide tube being rotatably mounted at a position between said feed mechanism and said insert device,
   with said first guide tube being to determine a direction along which the wire is to extend and an amount of bending of a portion of the wire between said feed mechanism and said first guide tube.

6. The apparatus according to claim 5, further comprising:
a second guide tube for guiding a portion of the wire to be fed into said first guide tube.

7. The apparatus according to claim 1, wherein said feed device includes a first guide tube for guiding the wire to said insert device, with said first guide tube including a plurality of rollers for straightening the wire.

8. The apparatus according to claim 7, wherein said feed device further includes a drive mechanism for feeding the wire, with said plurality of rollers being drivingly connected to said drive mechanism.

9. An apparatus for mounting a wire component onto a substrate, comprising:
a feed device for intermittently feeding a wire a predetermined distance, said feed device being constructed and arranged to move between a first position at which the wire is to be fed the predetermined distance so as to provide a fed-out predetermined length of wire and a second position at which the fed-out predetermined length of wire is to intersect a predetermined axis; and an insert device for receiving, cutting and bending the fed-out predetermined length of wire to form a wire component, rotating and positioning the wire component, and then inserting the wire component into a hole in a substrate, said insert device being constructed and arranged to rotate about the predetermined axis, so that an outer edge of said insert device defines a circle, between a third position at which said insert device is to insert the wire component into the hole in the substrate and a fourth position at which said insert device is to receive the fed-out predetermined length of wire, wherein when said feed device is in the first position the fed-out predetermined length of wire is outside the circle defined by the outer edge of said insert device.

10. The apparatus according to claim 9, further comprising:
a substrate holder for holding the substrate; and
a controller for controlling said feed device, said insert device, and said substrate holder.

11. The apparatus according to claim 9, wherein said feed device is also constructed and arranged such that when said feed device is in the first position or the second position the wire is bent within its elastic range.

12. The apparatus according to claim 9, wherein said feed device is also constructed and arranged such that when said feed device is in the first position or the second position the wire is bent beyond its elastic limit.

13. The apparatus according to claim 9, wherein said feed device is also constructed and arranged such that an amount of bending of the wire is varied according to positioning rotation of the wire.

14. The apparatus according to claim 9, wherein said feed device includes
   (i) a feed mechanism for intermittently feeding the wire the predetermined distance, and
   (ii) a first guide tube for guiding the wire fed by said feed mechanism, said first guide tube being rotatably mounted at a position between said feed mechanism and said insert device,
   with said first guide tube being to determine a direction along which the wire is to extend and an amount of bending of a portion of the wire between said feed mechanism and said first guide tube.

15. The apparatus according to claim 14, further comprising:
a second guide tube for guiding a portion of the wire to be fed into said first guide tube.

16. The apparatus according to claim 9, wherein said feed device includes a first guide tube for guiding the wire to said insert device, with said first guide tube including a plurality of rollers for straightening the wire.

17. The apparatus according to claim 16, wherein said feed device further includes a drive mechanism for feeding the wire, with said plurality of rollers being drivingly connected to said drive mechanism.

* * * * *

UNITED STATES PATENT AND TRADEMARK OFFICE
CERTIFICATE OF CORRECTION

PATENT NO. : 6,715,205 B2
DATED : April 6, 2004
INVENTOR(S) : Hideaki Watanabe et al.

It is certified that error appears in the above-identified patent and that said Letters Patent is hereby corrected as shown below:

Title page,
Item [57], ABSTRACT,
Line 6, change "in" to -- into --.
Line 9, change "would" to -- will --.

Signed and Sealed this

Nineteenth Day of July, 2005

JON W. DUDAS
*Director of the United States Patent and Trademark Office*